(12) United States Patent
Tanji et al.

(10) Patent No.: US 6,943,618 B1
(45) Date of Patent: Sep. 13, 2005

(54) COMPENSATION MECHANISM FOR COMPENSATING BIAS LEVELS OF AN OPERATION CIRCUIT IN RESPONSE TO SUPPLY VOLTAGE CHANGES

(75) Inventors: Todd M. Tanji, Eagan, MN (US); Robert S. Wentink, Falcon Heights, MN (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/311,234

(22) Filed: May 13, 1999

(51) Int. Cl.[7] ................................................ G05F 3/02
(52) U.S. Cl. .................... 327/540; 327/538; 327/539; 327/545
(58) Field of Search ............................. 327/530, 538, 327/539, 540, 541, 545, 560, 561, 562, 52, 56, 65, 68; 330/96, 133, 134

(56) References Cited

U.S. PATENT DOCUMENTS

| 4,744,018 | A | * | 5/1988 | Eccleston | ................... | 363/16 |
| 5,047,657 | A | * | 9/1991 | Seevinck et al. | ........... | 327/306 |
| 5,103,158 | A | * | 4/1992 | Cho et al. | .................... | 327/537 |
| 5,359,552 | A | * | 10/1994 | Dhong et al. | ............... | 327/530 |
| 5,933,051 | A | * | 8/1999 | Tsuchida et al. | ............ | 327/543 |

* cited by examiner

Primary Examiner—Timothy P. Callahan
Assistant Examiner—An T. Luu
(74) Attorney, Agent, or Firm—John G. Shudy, Jr.

(57) ABSTRACT

A compensation circuit is disclosed for compensating bias levels of an operational circuit in response to variations in a supply voltage. The compensation mechanism identifies variations in the supply voltage by comparing the voltage of a selected node of the operation circuit with a relatively constant or fixed reference voltage. Based on the results of the comparison, the compensation mechanism adjusts selected bias levels in the operational circuit, preferably using current stealing circuitry, so that the functionality and performance of the operational circuit can be substantially maintained. A biasing circuit for biasing one or more differential pairs is also disclosed.

23 Claims, 5 Drawing Sheets

COMPENSATION MECHANISM FOR COMPENSATING BIAS LEVELS OF AN OPERATION CIRCUIT IN RESPONSE TO SUPPLY VOLTAGE CHANGES

CROSS REFERENCE TO CO-PENDING APPLICATIONS

The present application is related to U.S. patent application Ser. No. 09/311,242 filed May 13, 1999, entitled "Output Buffer With Independently Controllable Current Mirror Legs"; U.S. patent application Ser. No. 09/311,105 filed May 13, 1999, entitled "Differential Filter with Gyrator"; U.S. patent application Ser. No. 09/311,246 filed May 13, 1999, entitled "Filter with Controlled Offsets For Active Filter Selectivity and DC Offset Control"; U.S. patent application Ser. No. 09/311,092 filed May 13, 1999, entitled "State Validation Using Bi-Directional Wireless Link"; U.S. patent application Ser. No. 09/311,250 filed May 13, 1999, entitled "Wireless System With Variable Learned-In Transmit Power"; and U.S. patent application Ser. No. 09/311,014 filed May 13, 1999, entitled "Wireless Control Network With Scheduled Time Slots", all of which are assigned to the assignee of the present invention and incorporated herein by reference.

BACKGROUND OF THE INVENTION

This invention relates to analog circuits, and more particularly, to RF analog circuits of the type in which several transistors or other amplifying devices are combined to amplify a RF input signal. More specifically, the invention is directed to a technique for controlling the bias levels of selected amplifying devices in response to a degradation in a supply voltage.

The use of amplifiers and other circuits for signal conditioning radio frequency signals is well known in the art. RF analog circuits have been used in radio transceivers, television receivers, CB radios, microwave links, satellite communications systems, local RF networks, and other wireless communication and broadcast applications. A critical component of many amplifiers is the voltage bias circuitry that is used to bias the internal amplifying devices.

It is known that transistors and other amplifying devices typically have an active region in which there is a substantially linear relationship between gate or grid voltage and drain or plate current. The voltage bias circuitry is typically designed to provide a bias level that, when a null signal is applied to the grid, gate or other control electrode, the output current is at a desired quiescent level in about the center of the linear region of the device's active region. This bias condition typically provides optimum performance for the amplifier.

It is also desirable to provide a bias level such that a sufficient voltage is maintained across each amplifying device over all operating conditions, so as to avoid device saturation. If critical amplifying devices enter saturation, the amplifier may no longer operate in the linear range.

One important performance characteristic for many amplifiers is the dynamic range of the amplifier. The dynamic range corresponds to the range from the minimum usable input signal to the maximum usable input signal. The minimum usable input signal is often dictated by the internal noise of the amplifier. The maximum usable input signal is the maximum input signal that the amplifier can accept and amplify without distortion. The maximum usable input signal is typically dependent on a number of factors including the supply voltage used and the gain of the amplifier.

For many applications, such as low power applications, it is desirable to use a relatively low supply voltage. Since the dynamic range of an amplifier is typically dependent on the supply voltage, the dynamic range of an amplifier that is powered by a relatively low supply voltage tends to be less than a similar amplifier that is powered by a higher supply voltage.

In addition, it is also desirable to use a self-contained power source such as a battery or the like for many low power applications. The reason some applications are low power applications is because they are powered by a battery. As is known, however, the voltage provided by batteries tends to degrade over time, especially for alkaline batteries. Accordingly, the dynamic range of an amplifier that is powered by a battery will tend to degrade over time. Moreover, if the supply voltage degrades beyond some critical point, some or all of the amplifying devices may enter saturation and the amplifier may cease to operate in a linear mode.

One approach for maintaining the functionality and performance of an amplifier when using a low and/or degrading power supply is to optimize the bias levels under worst case conditions. For example, the bias levels may be set so that after the supply voltage degrades over time, a sufficient voltage is still maintained across each amplifying device to prevent device saturation. A limitation of this approach is, of course, that the performance of the amplifier is typically less than optimal under nominal conditions. Further, the design constraints imposed by designing an amplifier that uses fixed bias levels to maintain satisfactory performance over all operating conditions can increase the complexity of the design.

What would be desirable, therefore, is an amplifier that has a compensation circuit that dynamically compensates selected bias levels within the amplifier to maintain operation and performance over a relatively wide range of supply voltages. This may increase the performance of the amplifier under all operating conditions, and may significantly simplify the amplifier design.

SUMMARY OF THE INVENTION

The present invention overcomes many of the disadvantages of the prior art by providing a compensation circuit that dynamically compensates selected bias levels of an operational circuit (e.g., amplifier) in response to variations in the supply voltage. The compensation circuit changes selected bias levels in view of sensed variations in the supply voltage so that the functionality and performance of the operational circuit are substantially maintained.

In one illustrative embodiment, a circuit node is selected within an operational circuit, wherein the voltage at the selected circuit node is dependent on variations in the supply voltage. A comparator is used to compare a reference voltage, which is preferably relatively independent of the variations in the supply voltage, against the voltage sensed at the selected circuit node. A compensation circuit then adjusts selected bias levels in the operational circuit such that the voltage at the selected circuit node becomes equal to (or has some other predetermined relationship with) the reference voltage.

In one embodiment, the operational circuit is an amplifier that has a differential pair of transistors and a current source transistor. The drain of the current source transistor is connected to the source of each of the differential pair of transistors. Each of the drain terminals of the differential pair of transistors is connected to the supply voltage through a corresponding load resistor. A differential output signal is then provided between the drain terminals of the differential pair of transistors. In another embodiment, only one of the two drain terminals is tapped, thus making a single-ended output.

To keep the differential pair of transistors and/or the current source transistor operating in the active region, a sufficient voltage is maintained across each of them. This is preferably accomplished by limiting the maximum current that can pass through each of the load resistors. By doing so, the maximum voltage drop across each of the load resistors is small enough so that the differential pair of transistors and the current source transistor are kept out of saturation.

Preferably, the voltage at a selected node, such as the source terminals of the differential pair of transistors, is monitored. Using an active feedback loop, the bias level provided to the gate terminals of the differential pair of transistors is adjusted so that the current that flows through the load resistors is limited, and the voltage across the load resistor is controlled. Because the voltage drop across the load resistors is limited, a sufficient voltage remains at the source of the differential pair of transistors, which keeps at least the current source transistor out of saturation.

It is contemplated that the active feedback loop may include a comparator, such as an operational amplifier, for comparing the voltage at the source of the differential pair of transistors to a reference voltage. The reference voltage may be set to be substantially greater than or equal to the saturation voltage of the current source transistor.

In another embodiment, the compensation circuit senses the voltage at the drain of either of the differential pair of transistors. Like the previous embodiment, this embodiment adjusts the bias level at the gate terminals of the differential pair of transistors until the voltage at the drain terminal equals a reference voltage. In this embodiment, the reference voltage may be set substantially equal to the saturation voltage of the current source transistor plus the saturation voltage of the differential pair of transistors.

An input stage may be used to adjust the gate terminals of the differential pair of transistors. The input stage may include one or more amplifying devices such as FETs or BJTs connected between ground and the gate terminals of the differential pair of transistors. The one or more amplifying devices may have, for example, a FET connected in series with a cascade transistor. A pull-up resistor may then be connected between the gate terminals of the differential pair of transistors and the supply voltage. The gate of one of the amplifying devices may receive an RF input signal.

In use, when the RF input signal goes high, the drive of the FET or BJT devices of the input stage may increase, allowing a larger current to flow through the pull-up resistor. This causes a larger voltage drop across the pull-up resistor, and a corresponding reduction in voltage at the gate terminals of the differential pair of transistors. Likewise, when the RF input signal goes low, the drive of the FET or BJT devices may decrease, causing a smaller current to flow through the pull-up resistor. This causes a smaller voltage drop across the pull-up resistor, and a corresponding rise in voltage at the gate terminals of the differential pair of transistors. Thus, for RF type signals, the input stage may function as an inverting amplifier.

To help adjust the bias level at the gate terminals of the differential pair of transistors, the input stage may include a current stealing circuit. The current stealing circuit may include, for example, a bypass transistor or the like that is connected in parallel with the pull-up resistor. The gate of the bypass transistor may be controlled by the output of the comparator. As described above, the comparator may include an operational amplifier or the like that compares the voltage of a selected node of the operational circuit, such as the drain (or source) of a differential pair of transistors, to a reference voltage.

If the voltage of the drain (or source) of the differential pair of transistors is higher than a reference voltage, the comparator may decrease the voltage at the gate of the bypass transistor, which provides a bypass current around the pull-up resistor, and increases the bias voltage at the gate terminals of the differential pair of transistors. An increased voltage at the gate terminals of the differential pair of transistors increases the current through the load resistors, and reduces the voltage at the drain (or source) of the differential pair of transistors.

Likewise, if the voltage at the drain (or source) of the differential pair of transistors has a voltage that is lower than the reference voltage, the comparator may increase the voltage at the gate of the bypass transistor, which in turn decreases the bias voltage at the gate terminals of the differential pair of transistors. A decreased voltage at the gate terminals of the differential pair of transistors decreases the current through the load resistors, and increases the voltage at the drain (or source) of the differential pair of transistors. Thus, the bias levels of the differential pair of transistors may be dynamically adjusted so that the amplifier may maintain operation and performance over a relatively wide range of supply voltages.

It is contemplated that the compensation circuit may adjust circuit parameters other than the bias voltage at the gate terminals of a differential pair of transistors, so long as they directly or indirectly cause the voltage at the selected circuit node to assume a predetermined relationship with the reference voltage. For example, in another embodiment of the present invention, the current stealing circuitry is placed in parallel with one or more of the load resistors of the differential amplifier circuit. The current stealing circuitry may include a bypass transistor that selectively bypasses current around one or more of the load resistors to adjust the voltage at the drain terminals of the differential pair of transistors. This approach provides another illustrative way to control the voltage of the drain (or source) terminals of the differential pair of transistors.

In this latter embodiment, bypass transistors are preferably placed in parallel with each of the load resistors. The bypass transistors preferably have gate terminals that are controlled by a comparator, wherein the comparator compares the voltage at a selected circuit node of the operational circuit, such as the drain (or source) of the differential pair of transistors, to a reference voltage. Rather than adjusting the bias level of the gate terminals of the differential pair, however, the bypass transistors of this embodiment adjust the voltage at the source of the differential pair of transistors by providing a controllable resistance in parallel with the load resistors.

In use, if the voltage at the drain (or source) of the differential pair of transistors is higher than a predetermined reference voltage, the comparator increases the voltage at the gate terminals of the bypass transistors. This increases the resistance between the source of the differential pair of transistors and the supply voltage, and for a given source/drain current, decreases the bias level at the drain (or source) of the differential pair of transistors. Likewise, if the voltage at the drain (or source) of the differential pair of transistors is lower than the reference voltage, the comparator decreases the voltage at the gate of the bypass transistors. This decreases the resistance between the source of the differential pair of transistors and the supply voltage, and for a given source/drain current, increases the bias level at the drain (or source) of the differential pair of transistors. What is provided, then, is a compensation circuit that can dynamically compensate selected bias levels within an operational circuit (e.g., amplifier) to maintain operation and performance over a relatively wide range of supply voltages.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

The present invention provides a compensation circuit that can dynamically compensate bias levels of selected devices of an operational circuit (e.g., amplifier) in response to variations in the supply voltage. The compensation circuit changes the bias levels in view of variations in the supply voltage so that functionality and performance of the operational circuit are substantially maintained.

Figure 1:
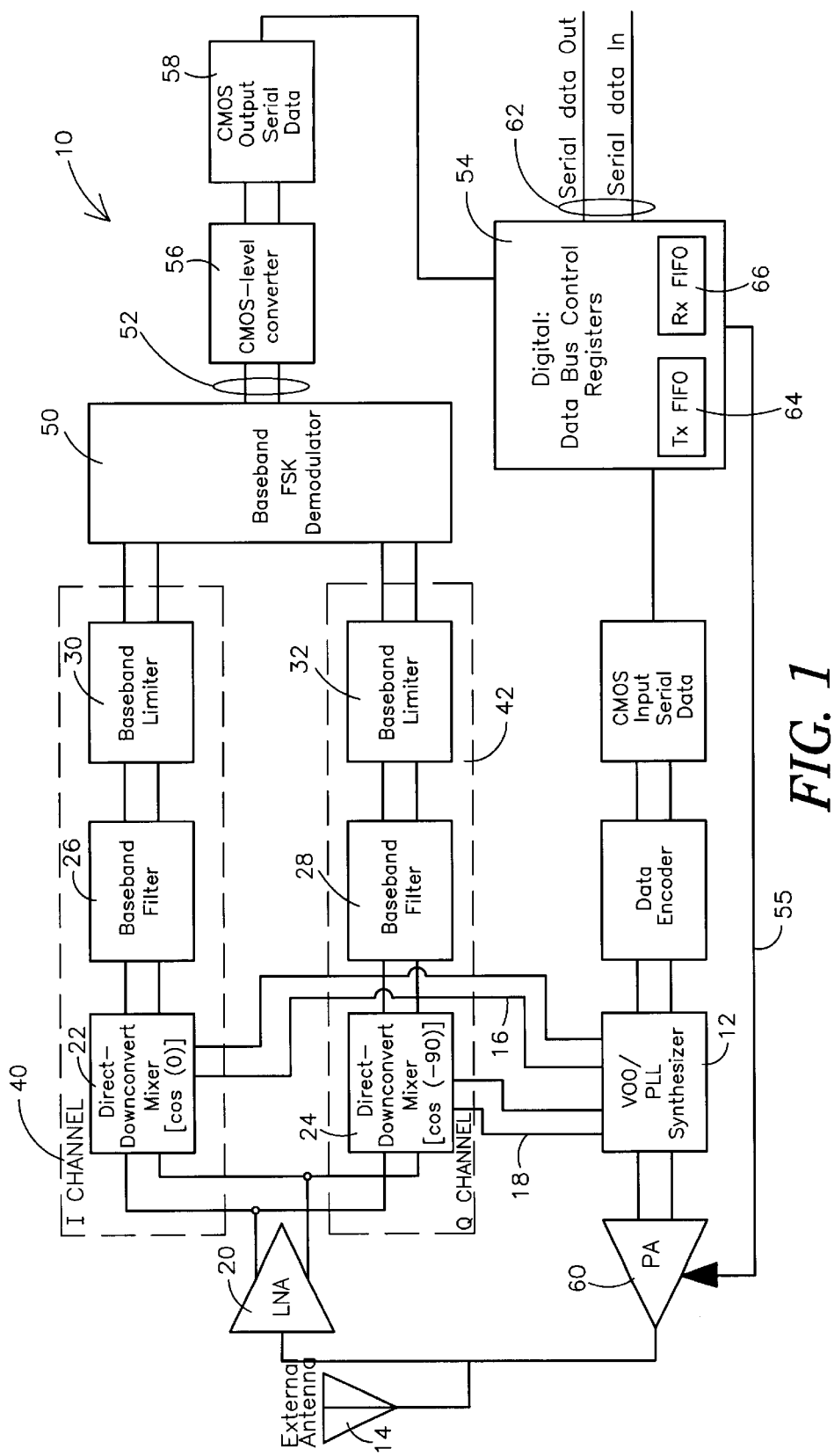
FIG. 1 is a block diagram of an integrated Direct Down Conversion Narrowband FSK Transceiver incorporating the present invention.

FIG. 1 is a block diagram of an integrated direct down conversion Narrowband FSK Transceiver 10 that incorporates the present invention. The Narrow Band FSK Transceiver 10 includes both transmit and receive functions, preferably on a single substrate with minimal use of external components. In use, the Narrow Band FSK Transceiver 10 provides a half-duplex transceiver radio data link capable of statistical frequency-spread transmissions.

Two or more Narrow Band Transceivers 10 can be used to form a wireless data communication network. Because each Narrowband FSK Transceiver 10 includes both transmit and receive functions, bi-directional transmission is possible. Bi-directional transmission allows data transfers to be confirmed, thereby increasing the reliability of the link to near 100 percent, depending on the access control algorithm implemented by the user.

The basic architecture of the Narrowband FSK Transceiver 10 is shown in FIG. 1. Off-chip components may include a crystal (which can be shared with an applications microprocessor), front end LC matching and filtering components, LC circuits for tuning the Phase Lock Loop (PLL)/Voltage Controlled Oscillator (VCO) 12, some external capacitors for filtering supply noise, a printed circuit board (PCB), an antenna 14 and a power source. The single chip Narrowband FSK Transceiver 10 is intended for the 418 MHz, 434.92 MHz, 868–870 MHz, and 902–928 MHz frequency bands with FSK data rates up to 56 kbps.

The receiver design is based on the direct down conversion principle which mixes the input signal directly down to the baseband using a local oscillator at the carrier frequency. The direct down conversion principle is discussed in "Design Considerations for Direct-Conversion Receivers", by Behzad Rasavi, *IEEE Transactions On Circuits and Systems—II; Analog and Digital Signal Processing*, Vol. 44, No. 6, June 1997. In a direct down conversion algorithm, two complete signal paths are provided including an I-channel 40 and a Q-channel 42, where the Q-channel 42 has a 90 degree phase shift relative to the I-channel 40. The I-channel 40 and the Q-channel 42 are used to demodulate the received signal.

Accordingly, the received signal is first provided to a low noise amplifier (LNA) 20. The LNA 20 preferably includes a compensation circuit that actively compensates selected bias levels within the LNA 20 in response to variations in the supply voltage, as more fully described below with reference to FIGS. 2–3. LNA 20 differentially drives a quadrature mixer pair 22 and 24. As indicated above, the input signal provided to mixer 24 is phase shifted 90 degrees relative to the input signal provided to mixer 22.

The PLL synthesizer/(VCO) 12 provides local oscillator (LO) signals in phase quadrature to mixers 22 and 24 via interfaces 16 and 18, respectively. Mixer 22 mixes the non-phase shifted LO signal with the input signal, while Mixer 24 mixes the 90 degree phase shifted LO signal with the same input signal. In accordance with the present invention, mixers 22 and 24 also preferably include a compensation circuit that actively compensates selected bias levels in response to variations in supply voltage, as more fully described below with reference to FIGS. 4–5.

The differential outputs of mixer 22 and mixer 24 are provided down two identical signal channels in quadrature phase: the I-channel 40 and the Q-channel 42. I-channel 40 includes baseband filter block 26, and Q-channel 42 includes baseband filter block 28. Each baseband filter block may include a single pole low pass filter, followed by a second order filter (with two near-DC high-pass poles and two wideband low-pass poles), and a gyrator filter. The main channel filter of each baseband filter block is the gyrator filter, which preferably includes a gyrator-capacitor implementation of a 7-pole elliptic low-pass filter. A preferred 7-pole elliptic low-pass filter is described in U.S. patent application Ser. No. 09/311,105, entitled "Differential Filter With Gyrator". The elliptic filter minimizes the total capacitance required for a given selectivity and dynamic range. In a preferred embodiment, the low-pass gyrator cut-off frequency can be adjusted by an external resistor.

I-channel 40 may also include limiter block 30, and Q-channel 42 may include limiter block 32. Limiter blocks 30 and 32 preferably limit the amplitudes of the corresponding signals to remove the amplitude information before the signals are provided to the demodulator 50. At least one of the limiter blocks 30 and 32 may contain an RSSI (Receive Signal Strength Indicator) output that can be used for Forward-and-Reverse link power management for DSSS applications or for demodulating ASK (Amplitude Shift Key) or OOK (On Off Key) signals. One such power management approach is described in U.S. patent application Ser. No. 09/311,250, entitled "Wireless System With Variable Learned-In Transmit Power". The RSSI signal may also be used by AFC (Automatic Frequency Control frequency tracking) or AGC (Automatic Gain Control dynamic range enhancement), or both.

The demodulator 50 combines and demodulates the I- and Q-channel outputs to produce a digital data output 52. In doing so, the demodulator 50 detects the relative phase difference between the I- and Q-channel signals. If the I-channel signal leads the Q-channel signal, the FSK tone frequency lies above the tone frequency, indicating a data '1' state. If the I-channel signal lags the Q-channel signal, the FSK tone frequency lies below the tone frequency, indicating a data '0' state. The digitized output 52 of the receiver is provided to Control block 54 via CMOS-level converter 56 and CMOS Output Serial Data block 58.

The transmitter of the Narrowband FSK Transceiver 10 includes a PLL frequency synthesizer and a power amplifier 60. A preferred implementation of power amplifier 60 is shown and described in co-pending U.S. patent application Ser. No. 09/311,242, entitled "Output Buffer With Independently Controllable Current Mirror Legs". The frequency synthesizer may include a voltage-controlled oscillator (VCO) 12, a crystal oscillator, a prescaler, a number of programmable frequency dividers, and a phase detector. A loop filter may also be provided external to the chip for flexibility, which may be a simple passive circuit. The VCO 12 preferably provides one or more on-chip varactors. In one embodiment, the VCO 12 includes a high tune sensitivity varactor for wideband modulation and a low tune sensitivity varactor for narrowband modulation. The modulation varactor that is chosen depends on the particular application. The modulation varactors are used to modulate a serial data stream onto a selected carrier frequency. The modulated signal is provided to the power amplifier 60, which drives the external antenna 14.

Preferably, the output power level of the power amplifier 60 can be controlled by Control block 54 via interface 55. This allows a transmitting Narrowband FSK Transceiver 10 to transmit a signal at a relatively low power level to conserve system power. If an acknowledge is received from a receiving Narrowband FSK Transceiver, the transmission is complete. If an acknowledge is not received, however, the transmitting Narrowband FSK Transceiver may increase the power level of the power amplifier 60. If an acknowledge is still not received from a receiving Narrowband FSK Transceiver, the transmitting Narrowband FSK Transceiver may again increase the power level of the power amplifier 60. This may be repeated until an acknowledge is received, or the maximum power level of the power amplifier 60 is reached. A further discussion of this and other power management algorithms are described in co-pending U.S. patent application Ser. No. 09/311,250, entitled "Wireless System With Variable Learned-In Transmit Power".

A four-pin Serial Peripheral Interface (SPI) bus 62 is used to program the internal configuration registers of the control block 54, and access the transmit (Tx) FIFO 64 and the receive (Rx) FIFO 66. During a transmit operation, data bytes are written to the Tx FIFO 64 over the SPI bus 62. The controller block 54 reads the data from the Tx FIFO 64, and shifts the data serially with the addition of Start and Stop bits to VCO 12 for modulation. As indicated above, VCO 12 then provides the modulated signal to power amplifier 60, which drives the external antenna 14.

During a receive operation, the received signal is provided to LNA 20, down I-channel 40 and Q-channel 42 as described above, and finally to demodulator 50. The demodulated signal is then over-sampled to detect the Start and Stop bits for synchronization. After a complete byte is serially collected, including the corresponding Start and Stop bits, the byte is transferred to the Rx FIFO 66. The Controller block 54 senses when the Rx FIFO 66 has data, and sends an SPI interrupt signal on SPI bus 62, indicating that the Rx FIFO 66 is ready to be read by an external processor or the like (not shown).

Figure 2:
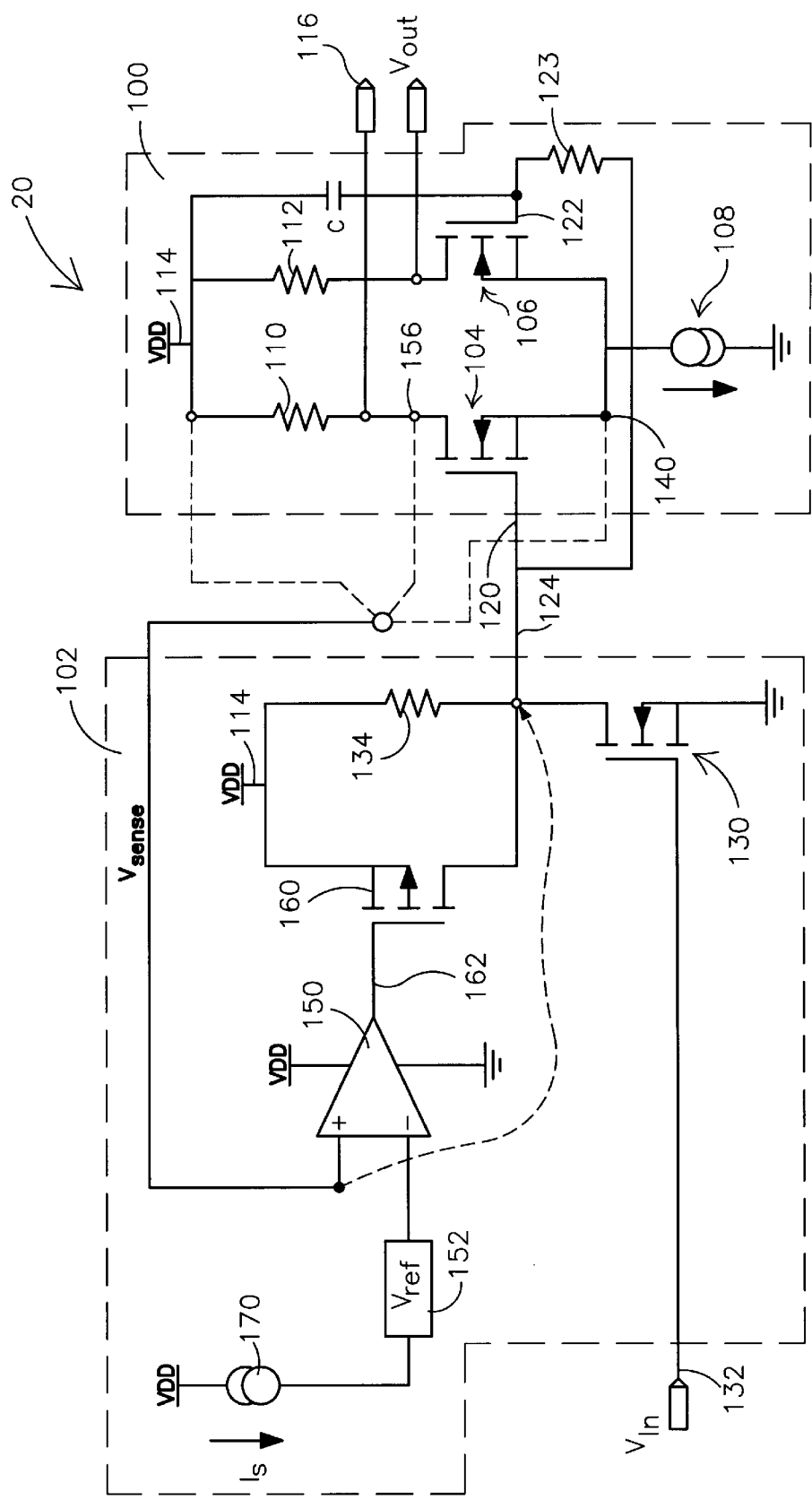
FIG. 2 shows a schematic view of a first illustrative embodiment of the Low Noise Amplifier (LNA) 20 of FIG. 1.

FIG. 2 shows a schematic view of a first illustrative embodiment of the Low Noise Amplifier (LNA) 20 of FIG. 1. The illustrative LNA 20 includes a differential amplifier 100 and an input stage 102. The differential amplifier 100 includes a differential pair of transistors 104 and 106, a current source 108, and two load resistors 110 and 112. The current source 108 may be a current source transistor that has a source connected to ground, a drain connected to the source of the differential pair of transistors 104 and 106, and a gate coupled to a reference voltage.

The two load resistors 110 and 112 are connected between the drain terminals of the differential pair of transistors 104 and 106 and the supply voltage 114. This configuration provides a differential output signal 116. For a single ended output signal, only one of the differential output taps would be used for Vout relative to signal ground.

The gate terminals 120 and 122 of the differential pair of transistors 104 and 106, respectively, are shown connected together through resistor 123 to provide a common DC voltage bias. Capacitor C, in conjunction with resistor 123, provide a low-pass to transistor 106, thus allowing only the common DC bias voltage to the gate of transistor 106. This provides a single-ended input to the differential pair. The single-ended input signal is then driven by the input stage 102.

The input stage 102 includes an amplifying device 130, such as an FET or BJT device. The source of the amplifying device 130 is connected to ground. The gate of the amplifying device 130 is connected to an RF input signal 132, and the drain is coupled to the common input terminal 124. A pull-up resistor 134 is connected between the common input terminal 124 and the supply voltage 114.

In operation, when the RF input signal 132 goes high, the drive of the N-channel FET or NPN BJT device 130 increases, allowing a larger current to flow through the pull-up resistor 134. This causes a larger voltage drop across the pull-up resistor 134, and a corresponding reduction in voltage at input terminal 124 and thus at the gate terminal 120 of transistor 104. Likewise, when the RF input signal 132 goes low, the drive of the N-channel FET or NPN BJT device 130 may decrease, causing a smaller current to flow through the pull-up resistor 134. This causes a smaller voltage drop across the pull-up resistor 134, and a corresponding rise in voltage at the input terminal 124. Thus, for RF type signals, the input stage 102 functions as an inverting amplifier.

Transistors 104 and 106, as well as other amplifying devices, typically have an active region in which there is a substantially linear relationship between gate or grid voltage and drain or plate current. Preferably, the voltage bias circuitry, which provides a DC bias level to selected transistors, is designed to provide a bias level that, when a null signal is applied to the grid, gate, or other control electrode, the output current is at a desired quiescent level in about the center of the linear region of the device's active region. This bias condition typically provides optimum performance for the amplifier. It is also desirable to design the circuit so that a sufficient voltage is maintained across each amplifying device, so as to avoid device saturation. If critical amplifying devices enter saturation, the amplifier may no longer operate in the linear range.

To keep the differential pair of transistors 104 and 106 and the current source transistor 108 operating in the- active region, a sufficient voltage must be maintained across each of these transistors. In one embodiment, this is accomplished by limiting the current that can pass through each of the load resistors 110 and 112. This limits the maximum voltage drop across each of the load resistors 110 and 112, leaving sufficient voltage across the differential pair of transistors 104 and 106 and the current source transistor 108 to avoid device saturation.

To accomplish this, the voltage at a selected node, such as source node 140 of the differential pair of transistors 104 and 106, can be monitored. Using an active feedback loop, the bias level provided to the gate terminals 120 and 122 of the differential pair of transistors 104 and 106 may then be adjusted so that the current that flows through the load resistors 110 and 112, and thus the voltage drop across the load resistors 110 and 112 is limited. Using this approach, a sufficient voltage may be maintained at the source 140 of the differential pair of transistors 104 and 106 to keep at least the current source transistor 108 out of saturation.

In the embodiment of FIG. 2, the active feedback loop includes a comparator 150, such as an operational amplifier, for comparing the voltage at the source 140 of the differential pair of transistors 104 and 106 to a reference voltage provided by reference voltage block 152. Because the selected node is the source 140 of the differential pair of transistors 104 and 106, the reference voltage provided by reference voltage block 152 is preferably substantially greater than or equal to the saturation voltage of the current source transistor 108.

In the above embodiment, the compensation circuit senses the voltage at the source 140 of the differential pair of transistors 104 and 106, and adjusts the bias level that is provided to the gate terminals 120 and 122 of the same devices. It is contemplated, however, that the compensation circuit may sense the voltage of any node in the operational circuit 100, provided the voltage of the selected node is dependent on variations in the supply voltage 114. For example, the compensation circuit may sense the voltage at the drain 156 of either of the differential pair of transistors 104 and 106, and may adjust the bias level provided to the gate terminals 120 and 122 of the differential pair of transistors 104 and 106 so that the voltage at the drain 156 equals a reference voltage. In this embodiment, the reference voltage may be set substantially equal to the saturation voltage of the current source transistor 108 plus the saturation voltage of the differential pair of transistors 104 and 106. As indicated in dotted lines, it is contemplated that the selected may also be the voltage supply 114, itself, or any other node in the operational circuit 100 that is dependent on voltage variation in the supply voltage.

To adjust the bias level at the gate terminals 120 and 122 of the differential pair of transistors 104 and 106, it is contemplated that the input stage 102 may include a current stealing circuit, such as bypass transistor 160. Bypass transistor 160 is shown connected in parallel with the pull-up resistor 134. The gate 162 of the bypass transistor 160 is then controlled by the output of comparator 150. In this configuration, if the voltage of the selected node such as the drain (or source) of the differential pair of transistors 104 and 106 is higher than the reference voltage, the comparator 150 may decrease the voltage at the gate 162 of the bypass transistor 160. The bypass transistor 160 then provides a bypass current around the pull-up resistor 134, which increases the voltage at the gate terminals 120 and 122 of the differential pair of transistors 104 and 106. An increased voltage at the gate terminals 120 and 122 of the differential pair of transistors 104 and 106 increases the current through the load resistors 110 and 112, which reduces the voltage at the drain (or source) of the differential pair of transistors 104 and 106. Likewise, if the voltage at the selected node such as the drain (or source) of the differential pair of transistors 104 and 106 has a voltage that is lower than the reference voltage, the comparator 150 may increase the voltage at the gate 162 of the bypass transistor 160, which in turn decreases the voltage at the gate terminals 120 and 122 of the differential pair of transistors 104 and 106. A decreased voltage at the gate terminals 120 and 122 of the differential pair of transistors 104 and 106 decreases the current through the load resistors 110 and 112, which increases the voltage at the drain (or source) of the differential pair of transistors 104 and 106. Thus, the bias levels of the differential pair of transistors 104 and 106 may be dynamically adjusted so that amplifier 100 maintains operation and performance over a relatively wide range of supply voltages.

As indicated above, the reference voltage is preferably relatively independent of the variations in the supply voltage 114. This may be accomplished by using a bandgap reference. In a bandgap reference, the bandgap voltage of silicon is used as an internal reference to provide a regulated output voltage. In the illustrative embodiment, the bandgap reference regulates a current source 170, and the current source regulates a reference voltage block 152. Current source 170 provides a current that is relatively independent of the supply voltage 114. Reference voltage block 152 consists of one or more diodes connected between the bandgap reference regulated current source output and ground. The voltage across the diodes thus depends on the current provided by the current source 170, which depends on the bandgap of silicon. The reference voltage does not, however, depend on the supply voltage 114.

Figure 3:
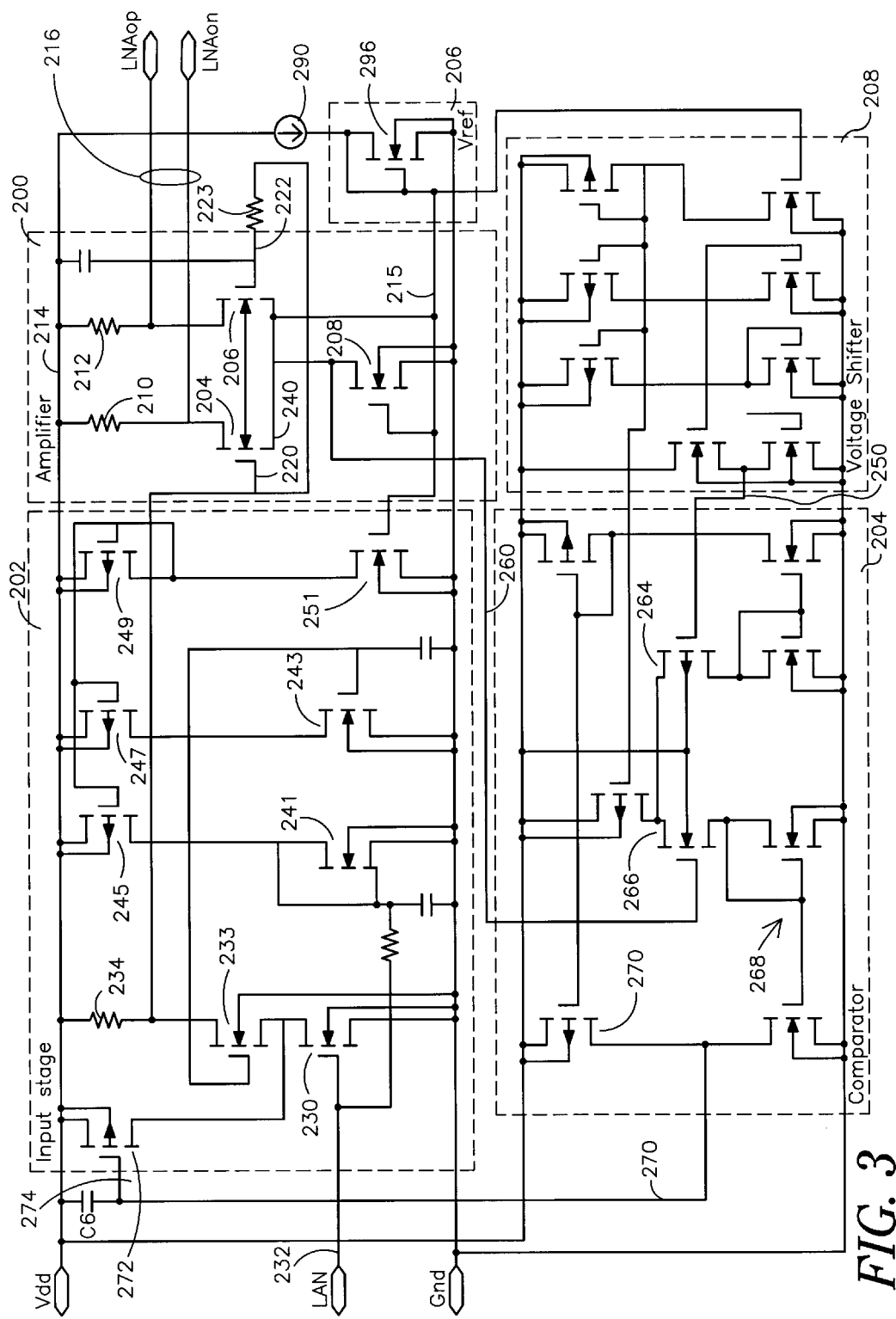
FIG. 3 is a schematic view of another illustrative embodiment of the Low Noise Amplifier (LNA) 20 of FIG. 1.

FIG. 3 is a schematic view of another illustrative embodiment of the Low Noise Amplifier (LNA) 20 of FIG. 1. In this embodiment, LNA 20 includes a differential amplifier 200, a low noise input stage 202, a comparator 203, a voltage reference block 205, and a voltage shifter block 209. Like the embodiment of FIG. 2, the differential amplifier 200 includes a differential pair of transistors 204 and 206, a current source transistor 208, and two load resistors 210 and 212. The current source transistor 208 has a source connected to ground, a drain connected to the source of the differential pair of transistors 204 and 206, and a gate coupled to a reference voltage 215.

The two load resistors 210 and 212 are connected between the drain terminals of the differential pair of transistors 204 and 206 and the supply voltage 214. This configuration provides a differential output signal 216. For a single ended output signal, only one of the load resistors should be tapped.

The gate terminals 220 and 222 of the differential pair of transistors 204 and 206, respectively, are shown connected together through a resistor 223 to a common DC voltage bias. The capacitor C, in conjunction with resistor 223, provide a low-pass to transistor 206, thus allowing only the common DC bias voltage to the gate of transistor 206. This provides a single-ended input to a differential pair. Single-ended input signal 224 is driven by the input stage 202.

The input stage 202 includes an amplifying device 230, such as an FET or BJT device. The source of the amplifying device 230 is connected to ground. The gate of the amplifying device 230 is connected to an RF input signal 232. A cascade transistor 233 is connected between the drain of the amplifying device 230 and the common input terminal 224. The cascode transistor 233 increases the speed (band width) of the input stage by reducing the miller-capacitance effect as seen from the RF input signal 232. Transistors 241, 243, 245, 247, 249, and 251 are used to properly bias the gates of cascode transistor 233 and amplifying device 230. Finally, a pull-up resistor 234 is connected between the common input terminal 224 and the supply voltage 214.

In operation, when the RF input signal 232 goes high, the drive of the N-channel FET or NPN BJT device 230 increases, allowing a larger current to flow through the pull-up resistor 234, thereby causing a larger voltage drop across the pull-up resistor 234. This produces a corresponding reduction in voltage at common input terminal 224, and thus at gate terminal 220 of transistor 204. Likewise, when the RF input signal 232 goes low, the drive of the N-channel FET or NPN BJT device 230 may decrease, causing a smaller current to flow through the pull-up resistor 234, and a smaller voltage drop across the pull-up resistor 234. This produces a corresponding rise in voltage at the input terminal 224, and thus at the gate terminal 220 of transistor 204. Thus, for RF type signals, the input stage 202 functions as an inverting amplifier.

To keep the differential pair of transistors 204 and 206 and the current source transistor 208 operating in the active region, a sufficient voltage must be maintained across each of these transistors. In one embodiment, this is accomplished by limiting the current that passes through each of the load resistors 210 and 212. This limits the maximum voltage drop across each of the load resistors 210 and 212, leaving a sufficient voltage across the differential pair of transistors 204 and 206 and the current source transistor 208 to prevent device saturation.

To help ensure that sufficient voltage is maintained across the differential pair of transistors 204 and 206 and the current source transistor 208, the voltage at a selected node, such as the source 240 of the differential pair of transistors 204 and 206, is monitored. Using an active feedback loop, the bias level provided to the gate terminals 220 and 222 of the differential pair of transistors 204 and 206 may then be adjusted so that the current that flows through the load resistors 210 and 212 is limited or controlled. Using this approach, a sufficient voltage may be maintained at the source 240 of the differential pair of transistors 204 and 206 to keep at least the current source transistor 208 out of saturation.

In the embodiment shown in FIG. 3, the active feedback loop includes the comparator 204 for comparing the voltage at the source node 240 of the differential pair of transistors 204 and 206 to a reference voltage provided by reference voltage block 206 and shifted by voltage shifter 208. The source node 240 of the differential pair of transistors 204 and 206 is provided to comparator 204 via interface 260, and the reference voltage is provided to the comparator 204 via interface 250. Transistors 266 and 264 perform the comparison between the voltage at the source node 240 of the differential pair of transistors 204 and 206 and the reference voltage. Current mirror 268 and p-channel transistor 270 provides an error signal 270 that is proportional to the difference between the voltage at the source node 240 of the differential pair of transistors 204 and 206 and the reference voltage.

The error signal 270 is provided to the gate 274 of bypass transistor 272. Bypass transistor 272 is shown connected in parallel with the pull-up resistor 234. In this configuration, if the voltage of the selected node 240 is higher than the reference voltage, the comparator 204 may decrease the error voltage at the gate 274 of the bypass transistor 272. The bypass transistor 272 then increases the bypass current around the pull-up resistor 234, which increases the voltage at the gate terminals 220 and 222 of the differential pair of transistors 204 and 206. An increased voltage at the gate terminals 220 and 222 of the differential pair of transistors 204 and 206 increases the current through the load resistors 210 and 212, which reduces the voltage at the drain (or source) of the differential pair of transistors 204 and 206.

Likewise, if the voltage at the selected node has a voltage that is lower than the reference voltage, the comparator 204 may increase the error voltage at the gate 274 of the bypass transistor 272. The bypass transistor 272 then decreases the bypass current around the pull-up resistor 234, which decreases the voltage at the gate terminals 220 and 222 of the differential pair of transistors 204 and 206. A decreased voltage at the gate terminals 220 and 222 of the differential pair of transistors 204 and 206 decreases the current through the load resistors 210 and 212, which increases the voltage at the drain (or source) of the differential pair of transistors 204 and 206. Thus, the bias levels of the differential pair of transistors 204 and 206 may be dynamically adjusted so that amplifier 200 maintains operation and performance over a relatively wide range of supply voltages.

The reference voltage is preferably relatively independent of the variations in the supply voltage 214. This may be accomplished by using a bandgap reference based reference, as described above. In a bandgap voltage reference circuit, the bandgap voltage of silicon is used as an internal reference to provide a voltage reference to a current source. The current source then provides a regulated current to a reference voltage block 206. Current source 290 provides a current that is relatively independent of the supply voltage 214. The current is provided to reference voltage block 206. Reference voltage block 206 includes a transistor 296 connected as a diode between the current source 290 and ground. The voltage across transistor 296 depends on the current provided by the current source 290, which is regulated by the bandgap of the silicon. The reference voltage does not, however, depend on the supply voltage 214.

The voltage shifter block 208 is used to shift the voltage provided by reference voltage block 206, to a reference voltage that is more appropriate, such as greater than or equal to the saturation voltage of the current source transistor 208. In the embodiment shown, the shifted reference voltage is provided to the comparator 204 via interface 250.

Figure 4:
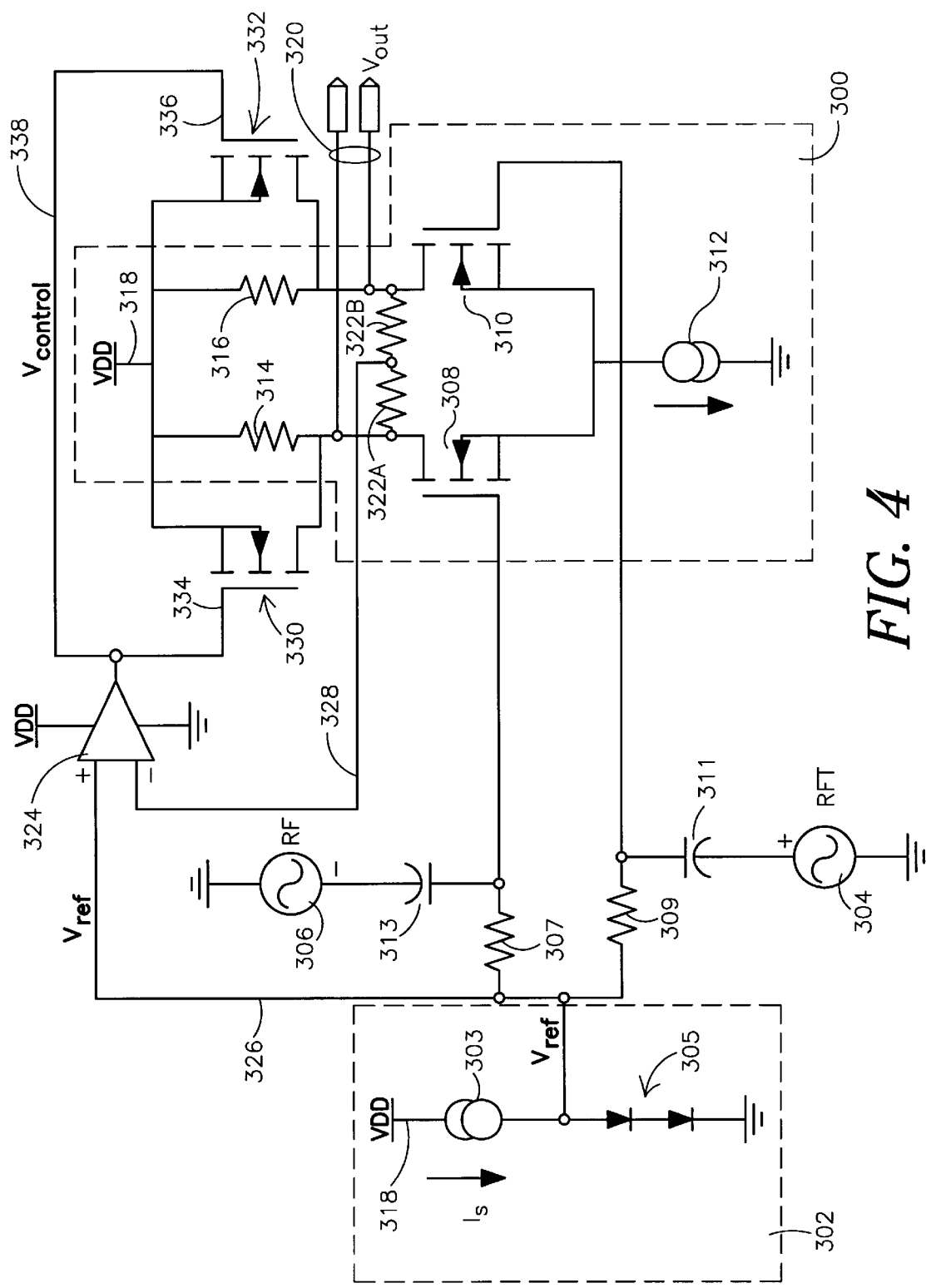
FIG. 4 is a schematic view of yet another illustrative embodiment of the present invention.

FIG. 4 is a schematic view of yet another illustrative embodiment of the present invention. In this embodiment, the current stealing circuitry is provided in parallel with the load resistors of the differential amplifier, and not across the pull-up resistor of an input stage as described above with respect to FIGS. 2–3. In FIG. 4, a differential amplifier 300 is provided that includes a differential pair of transistors 308 and 310, a current source 312, and two load resistors 314 and 316. The current source 312 draws a relatively constant current from the source terminals of the differential pair of transistors 308 and 310. The two load resistors 314 and 316 are connected between the drain terminals of the differential pair of transistors 308 and 310 and the supply voltage 318. In this configuration, a differential output signal 320 is provided between the drain terminals of the differential pair of transistors 308 and 310. For a single ended output signal, only one of the load resistors 314 or 316 may be tapped.

The current stealing circuitry of this embodiment includes bypass transistors 330 and 332. Preferably, bypass transistors 330 and 332 are placed in parallel with load resistors 314 and 316 of differential amplifier 300. Bypass transistors 330 and 332 each have a gate 334 and 336 that is controlled by a comparator 324. The comparator 324 compares the voltage of a selected circuit node 328 of the differential amplifier 300 to a reference voltage 326. Depending on the results of the comparison, the comparator either increases or decreases the conductivity of the bypass transistors 330 and 332, which alters the effective resistance between the supply voltage 318 and the drain terminals of the differential pair 308 and 310, and changes selected bias levels in the differential amplifier 300.

In the illustrative embodiment, the selected circuit node 328 corresponds to a node between two series resistors 322A and 322B connected between drain terminals of the differential pair of transistors 308 and 310. In this configuration, the voltage at the selected circuit node 328 is a common mode DC voltage representing the bias level at the drain terminals of the differential pair or transistors 308 and 310. Resistors 322A and 322B preferably have a resistance of about 40 kilo-ohms, which is large enough to substantially isolate the selected circuit node 328 from the RF output signal 320. However, the resistors 322A and 322B allow the common mode DC voltage at the selected circuit node 328 to be dependent on voltage variations in the supply voltage 318.

In use, if the common mode DC voltage at the selected circuit node 328 is higher than the reference voltage 326, the comparator 324 increases the voltage at the gates 334 and 336 of the bypass transistors 330 and 332. This increases the resistance between the drain terminals of the differential pair of transistors 308 and 310 and the supply voltage 318, and for a given source/drain current, decreases the common mode DC voltage at the selected circuit node 328. Likewise, if the common mode DC voltage is lower than the reference voltage 326, the comparator 324 decreases the voltage at the gates 334 and 336 of the bypass transistors 330 and 332. This decreases the resistance between the drain terminals of the differential pair of transistors 308 and 310 and the supply voltage 318, and for a given source/drain current, increases the common mode DC voltage at the selected circuit node 328. What is provided, then, is a compensation circuit that actively compensates selected bias levels within the differential amplifier 300 by providing a controllable resistance in parallel with selected load resistors 314 and 316 to maintain the operation and performance of amplifier 300 over a relatively wide range of supply voltages. The same technique may be used to compensate selected bias levels in response to other parameters such as processing tolerances, temperature effects, etc.

In the embodiment of FIG. 4, the gate terminals of the differential pair of transistors 308 and 310 are biased using a reference voltage generator 302 and two biasing resistors 307 and 309. The reference voltage generator provides a reference voltage to the two biasing resistors 307 and 309 via interface 326. The biasing resistors 307 and 309 provide the reference voltage to the gate terminals of the differential pair of transistors 308 and 310.

The differential pair of transistors 308 and 310 are preferably Field Effect Transistor (FET) devices. FET devices have a relatively high input impedance, and therefore, very little DC biasing current passes through biasing resistors 307 and 309 to properly bias the gate terminals of the differential pair of transistors 308 and 310. Accordingly, biasing resistors 307 and 309 can be relatively large, and still appear as a DC short to the reference voltage generator 302 and the gate terminals of the differential pair of transistors 308 and 310.

Typically, an RF input signal is provided on top of the DC biasing levels provided by reference voltage generator 302 and biasing resistors 307 and 309. In the embodiment shown, a differential RF input signal is AC coupled directly to the gate terminals of the differential amplifier 300. A positive RF input signal, represented by source 304, is AC coupled to the gate terminal of differential transistor 310 via capacitor 311. Likewise, a negative RF input signal, represented by source 306, is AC coupled to the gate terminal of differential transistor 308 via capacitor 313. The terms "positive" RF input signal and "negative" RF input signal are used herein to designate a relative relationship between signals, as is common in the art.

Biasing resistors 307 and 309 are preferably relatively large (e.g., on the order of 20 kilo-ohms) to help isolate the output of the reference voltage generator 302 from the positive RF input signal 304 and the negative RF input signal 306. Large resistances appear like an open to an RF input signal. Isolating the reference voltage from the positive RF input signal 304 and negative RF input signal 306 helps produce a stable reference voltage at the comparator 324, and stable bias levels at the differential amplifier 300. This is particularly desirable because the comparator 324 compares the reference voltage 326 to the common mode DC voltage at the selected circuit node 328. This comparison can be more accurately performed when the reference voltage 326 is a DC signal, effectively isolated from the positive RF input signal 304 and negative RF input signal 306.

Even if some of the positive RF input signal 304 and negative RF input signal 306 pass through resistors 307 and 309, and encounter the output of the reference voltage generator 302, the positive RF input signal 304 will tend to cancel out the negative RF input signal 306. To maximize this canceling effect, resistors 307 and 309 are preferably matched devices. Likewise, capacitors 311 and 313, and transistors 308 and 310, are also preferably matched devices. This helps maintain a stable reference voltage even when some of the RF input signal passes through resistors 307 and 309 and reaches the output 326 of the reference voltage generator 302.

In order for the selected circuit node 328 to maintain a relatively constant voltage despite variation in the supply voltage 318, the reference voltage generator 302 must produce a reference voltage that is relatively independent of the voltage variations in the supply voltage 318. One way of accomplishing this is to use a bandgap reference, as described above. In the embodiment shown, current source 303 provides a current that is relatively independent of the supply voltage 318. The current is provided to two reference diodes, generally shown at 305. The reference diodes 305 are connected between the output 326 of the reference voltage generator 302 and ground. The voltage across the reference diodes 305 depends on the current provided by the current source 303 and the forward bias (bandgap) of the diodes 305. The reference voltage does not depend on the supply voltage 318. Comparator 324 forces the selected circuit node 328 to equal the reference voltage. Therefore, the selected circuit node 328 is also relatively independent of variations in the supply voltage 318.

Figure 5:
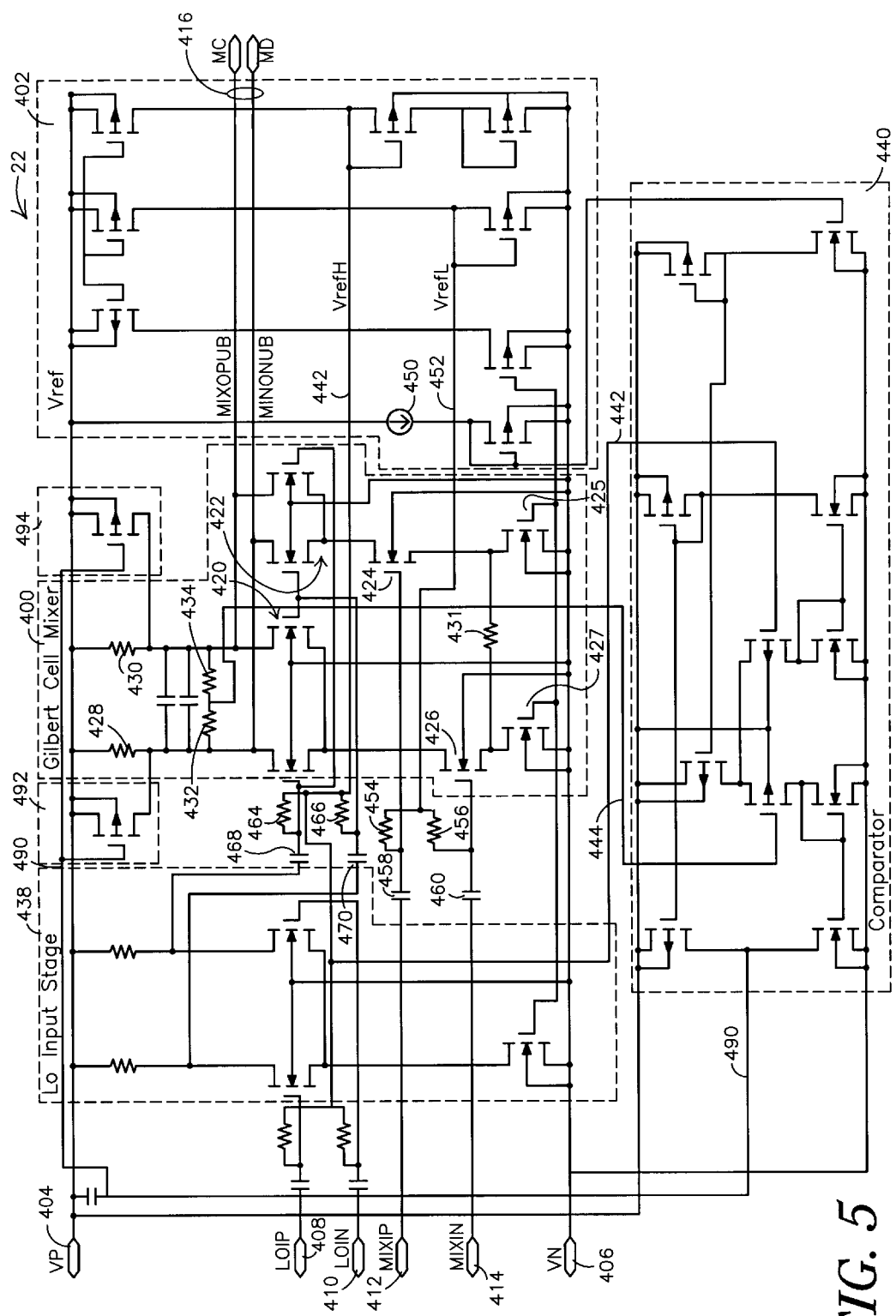
FIG. 5 is a schematic view of an illustrative embodiment of the Direct Convert Mixer 22 of FIG. 1, using the basic current stealing approach of FIG. 4.

FIG. 5 is a schematic view of an illustrative embodiment of the Direct Convert Mixer 22 of FIG. 1, using the basic current stealing approach of FIG. 4. Mixer 22 includes a positive power supply (VP) 404, a negative power supply (VN) 406, a differential local oscillator input signal including a positive local oscillator input (LOIP) 408 and a negative local oscillator input (LOIN) 410, and a differential input signal including a positive input (MIXIP) 412 and a negative input (MIXIN) 414. Mixer 22 produces a differential mixer output signal 416 including a positive mixer output (MIXOPUB) signal and a negative mixer output (MIXONUB) signal.

The purpose of the mixer 22 is to mix or multiply the differential local oscillator signal LOIP/LOIN, which operates at a selected carrier frequency such as 915 MHz, with the differential RF signal MIXIP/MIXIN, which has a similar or exact same center frequency as the LOIP/LOIN signals. MIXIP/MIXIN preferably has the same exact center frequency as the LOIP/LOIN fixed frequency signal for direct down conversion mixer applications. The resultant mixed-down output signal MIXOPUB/MIXONUB has a center frequency that is the difference between the LOIP/LOIN frequency and the MIXIP/MIXIN center frequency. The mixer 22 includes a Gilbert cell mixer 400, a reference voltage generator 402, a comparator 440, and a LO Input Stage 438.

The Gilbert cell mixer 400 has a well-known structure including a pair of cross-connected differential amplifiers 420 and 422. Each of the differential amplifiers 420 and 422 has a pair of differential transistors. The differential local oscillator input signals LOIP 408 and LOIN 410 are connected to the differential amplifiers 420 and 422 via a local oscillator input stage 428. The drain of a first transistor of each of the differential amplifiers 420 and 422 is connected to the MIXONUB output terminal, and is further connected to the positive supply terminal VP 404 through a first load resistor 428. The drain of the second transistor of each of the differential amplifiers 420 and 422 is connected to the MIXOPUB output terminal, and is further connected to the positive supply terminal VP 404 through a second load resistor 430. The first load resistor 428 and the second load resistor 430 are preferably identical.

The source terminals of each of the differential amplifiers 420 and 422 are connected in common to a distinct controllable current source. In the embodiment shown, the source terminals of differential amplifier 420 are connected to ground through a first mixer transistor 426 and a first current source transistor 427. The first mixer transistor 426 is controlled by the negative input (MIXIN) signal 414. Likewise, the source terminals of the differential amplifier 422 are connected to ground through a second mixer transistor 424 and a second current source transistor 425. The second mixer transistor 424 is controlled by the positive input (MIXIP) signal 412. Further, the source terminals of the first and second mixer transistors 424 and 426 are connected together via a small (300 ohm) resistor 431. In this configuration, the Gilbert cell mixer 400 mixes or multiplies the differential local oscillator signal LOIP/LOIN with the differential RF input signal MIXIP/MIXIN to produce a frequency down converted baseband output signal 416. As indicated above with reference to FIG. 1, the baseband output signal may be passed to a filter block, such as broadband filter block 26.

Like the embodiment shown in FIG. 4, each of the differential amplifiers 420 and 422 are biased by a reference voltage generator block 402, through two biasing resistors. In the illustrative embodiment, the reference voltage generator block 402 includes a current source 450 along with selected diodes and current mirrors to produce a first reference voltage 442 and a second reference voltage 452. Preferably, the first reference voltage 442 and the second reference voltage 452 are relatively independent of voltage variations in the supply voltage between supply terminals VP 404 and VN 406.

The first reference voltage 442 is provided to the gate terminals of each of the differential amplifiers 420 and 422 via biasing resistors 464 and 466. The positive local oscillator input signal LOIP 408 is provided through LO input stage 438 and directly then AC coupled to the first transistor of each of the differential amplifiers 420 and 422 via capacitor 468. Likewise, the negative local oscillator input signal LOIN 410 is provided through LO input stage 438 and directly AC coupled to the second transistor of each of the differential amplifiers 420 and 422 via capacitor 470. The first mixer transistor 426 and the second mixer transistor 424 are biased in a similar manner, as are each of the differential pair of transistors in the local oscillator input stage 438. However, for the first mixer transistor 426 and the second mixer transistor 424, the second reference voltage 452 is used to bias the devices.

The current stealing circuitry of FIG. 5 includes bypass transistors 492 and 494, and is similar to that described with reference to FIG. 4. Preferably, bypass transistors 492 and 494 are placed in parallel with load resistors 428 and 430 of Gilbert cell mixer 400. Bypass transistors 492 and 494 each have a gate that is controlled by comparator 440. Comparator 440 compares the voltage of a selected circuit node 444 of the Gilbert cell mixer 400 to the first reference voltage 442. Depending on the results, comparator 440 either increases or decreases the conductivity of the bypass transistors 492 and 494, which alters the effective resistance across the load resistors 428 and 430, and changes selected bias levels in Gilbert cell mixer 400.

In the illustrative embodiment of FIG. 5, the selected circuit node 444 is provided between two series resistors 432 and 434 connected between the drain terminals of the corresponding differential amplifiers 420 and 422. In this configuration, the voltage at the selected circuit node 444 is a common mode DC voltage representing the DC bias level at the drain terminals of the differential amplifiers 420 and 422. Resistors 432 and 434 preferably have a resistance of about 40 kilo-ohms, which is large enough to substantially isolate the selected circuit node 444 from the RF output signals on the drain terminals of differential amplifiers 420 and 422. The series resistors 432 and 434 do, however, allow the common mode DC voltage at the selected circuit node 444 to depend on voltage variations in the supply voltage, and thus can be used to adjust the bias levels within the Gilbert cell mixer in response to variations in the supply voltage.

In use, if the common mode DC voltage at the selected circuit node 444 is higher than the first reference voltage 442, the comparator 440 increases the voltage at the gates of the bypass transistors 492 and 494. This increases the resistance between the drain terminals of the differential amplifiers 420 and 422 and the positive power supply terminal VP 404, and for a given source/drain current, decreases the common mode DC voltage at the selected circuit node 444. Likewise, if the common mode DC voltage is lower than the first reference voltage 442, the comparator 440 decreases the voltage at the gates of the bypass transistors 492 and 494. This decreases the resistance between the drain terminals of the differential amplifiers 420 and 422 and the positive power supply terminal VP 404, and for a given source/drain current, increases the common mode DC voltage at the selected circuit node 444. What is provided then, is a compensation circuit that dynamically compensates selected bias levels within the Gilbert cell mixer 400 by providing a controllable resistance in parallel with selected load resistors 428 and 430 to maintain operation and performance of the Gilbert cell mixer over a relatively wide range of supply voltages (or other parameter such as processing tolerances, temperature effects, etc.).

Having thus described the preferred embodiments of the present invention, those of skill in the art will readily appreciate that the teachings found herein may be applied to yet other embodiments within the scope of the claims hereto attached.

What is claimed is:

1. A compensation circuit to help prevent an operational circuit from entering saturation in response to variations in a supply voltage, the operational circuit having a number of devices connected in a predetermined manner via a number of circuit nodes, a selected circuit node having a voltage that is dependent on the supply voltage, the compensation circuit comprising:

reference voltage generating means for generating a predetermined reference voltage that is relatively independent of the variations in the supply voltage;

comparing means coupled to said reference voltage generating means for comparing the reference voltage to the voltage of the selected circuit node; and compensating means coupled to said comparing means for providing compensation to the operational circuit such that the voltage at the selected circuit node assumes a predetermined value relative to the reference voltage, wherein the predetermined value is selected to help keep the operational circuit out of saturation.

2. A compensation circuit according to claim 1, wherein the reference voltage generating means comprises:

current source means for providing a current that is relatively independent of the variations in the supply voltage; and current-to-voltage converter means coupled to said current source means for converting the current generated by the current source means to the reference voltage.

3. A compensation circuit according to claim 2, wherein said current source means includes a bandgap reference.

4. A compensation circuit according to claim 1, wherein the operational circuit includes an amplifier having a differential pair of transistors and a current source transistor, wherein the current source transistor has a drain that is connected to a drain of each of the differential pair of transistors.

5. A compensation circuit according to claim 4, wherein the selected circuit node corresponds to the drain terminals of the differential pair of transistors.

6. A compensation circuit according to claim 5, wherein the predetermined reference voltage is substantially equal to the saturation voltage of the current source transistor.

7. A compensation circuit according to claim 4, wherein each of the differential pair of transistors has a source, and wherein the selected circuit node corresponds to the source of one of the differential pair of transistors.

8. A compensation circuit according to claim 4, wherein the drain of each of the differential pair of transistors is connected to the supply voltage through a first and second resistor, respectively.

9. A compensation circuit according to claim 8, wherein said compensating means includes a first bypass transistor connected across the first resistor, and a second bypass transistor connected across the second resistor, said compensating means energizing the first and second bypass transistors such that the voltage of the selected circuit node assumes the predetermined value relative to the reference voltage.

10. A compensation circuit according to claim 4, wherein the amplifier further includes a low noise amplifier input stage having:

an input transistor having a source, drain, and gate, wherein the source of the input transistor is coupled to ground and the gate is coupled to a low noise input terminal;

a cascode transistor having a source, drain, and gate, wherein the source of the cascode transistor is coupled to the drain of the input transistor;

biasing means for providing a DC bias to the gate of the input transistor and the gate of the cascode transistor; and a resistive element coupled between the drain of the cascode transistor and the supply voltage.

11. A compensation circuit according to claim 10, further comprising a bypass transistor having a source, drain, and gate, the drain of the bypass transistor coupled to the source of the cascode transistor, the source of the bypass transistor coupled to the supply voltage, and the gate of the bypass transistor controlled by the comparing means.

12. A compensation circuit according to claim 10, wherein each of the differential pair of transistors of the amplifier have a gate that is coupled to the drain of the cascode transistor.

13. A compensation circuit according to claim 10, further comprising a bypass transistor having a source, drain, and gate, the drain of the bypass transistor coupled to the drain of the cascode transistor, the source of the bypass transistor coupled to the supply voltage, and the gate of the bypass transistor controlled by the comparing means.

14. An amplifier that has a number of devices connected in a predetermined manner via a number of circuit nodes, wherein a selected circuit node has a voltage that is dependent on the supply voltage, and wherein the supply voltage varies over time, the improvement comprising:

a reference voltage generating circuit for generating a reference voltage that is relatively independent of the variations in the supply voltage;

a comparing circuit coupled to said reference voltage generating circuit for comparing the reference voltage to the voltage of the selected circuit node; and a compensating circuit coupled to said comparing circuit for providing compensation to the amplifier such that the voltage of the selected circuit node assumes a predetermined value relative to the reference voltage, wherein the predetermined value is selected to help keep the amplifier out of saturation.

15. An improvement according to claim 14, wherein the amplifier includes a differential pair of transistors each having an input, and wherein said compensating circuit changes the voltage at the input of each of the differential pair of transistors such that the voltage of the selected circuit node assumes the predetermined value relative to the reference voltage.

16. An improvement according to claim 15, wherein the selected circuit node corresponds to the source of one of the differential pair of transistors.

17. An improvement according to claim 14, wherein the amplifier includes a differential pair of transistors each having a drain that is connected to the supply voltage through a first resistor and a second resistor, respectively, said compensating circuit including a bypass means for providing a sufficient bypass current from the supply voltage to the drain of each of the differential pair of transistors, thus bypassing the first and second resistors, until the voltage of the selected circuit node assumes the predetermined value relative to the reference voltage.

18. An improvement according to claim 17, wherein the selected circuit node corresponds to the drain of one of the differential pair of transistors.

19. A method for providing compensation to an operational circuit in response to variations in a supply voltage to help prevent the operational circuit from entering saturation, the operational circuit having a number of devices connected in a predetermined manner via a number of circuit nodes, a selected circuit node having a voltage that is dependent on the supply voltage, the method comprising the steps of:

comparing a reference voltage that is relatively independent of the variations in the supply voltage to the voltage of the selected circuit node; and providing compensation to the operational circuit such that the voltage of the selected circuit node assumes a predetermined value relative to the reference voltage, wherein the predetermined value is selected to help keep the operational circuit out of saturation.

20. A method according to claim 19, further comprising the step of generating the reference voltage that is relatively independent of the variations in the supply voltage.

21. A method according to claim 19, wherein the generating step includes the steps of:

providing a current that is relatively independent of the variations in the supply voltage; and converting the current generated by the current providing step to the reference voltage.

22. A method according to claim 19, wherein the compensation providing step includes the step of stealing current from a predetermined node of the operational circuit.

23. A method according to claim 22, wherein the stealing current includes the step of bypassing current around a predetermined resistive element.

* * * * *